United States Patent
Tomita

(10) Patent No.: US 9,653,539 B2
(45) Date of Patent: May 16, 2017

(54) SEMICONDUCTOR DEVICE

(71) Applicant: SHINDENGEN ELECTRIC MANUFACTURING CO., LTD., Tokyo (JP)

(72) Inventor: Masaaki Tomita, Hanno (JP)

(73) Assignee: SHINDENGEN ELECTRIC MANUFACTURING CO., LTD., Tokyo (JP)

(*) Notice: Subject to any disclaimer, the term of this patent is extended or adjusted under 35 U.S.C. 154(b) by 0 days.

(21) Appl. No.: 14/777,673

(22) PCT Filed: Mar. 25, 2013

(86) PCT No.: PCT/JP2013/058493
§ 371 (c)(1),
(2) Date: Sep. 16, 2015

(87) PCT Pub. No.: WO2014/155472
PCT Pub. Date: Oct. 2, 2014

(65) Prior Publication Data
US 2016/0079347 A1 Mar. 17, 2016

(51) Int. Cl.
*H01L 27/095* (2006.01)
*H01L 29/06* (2006.01)
*H01L 29/36* (2006.01)
(Continued)

(52) U.S. Cl.
CPC ...... *H01L 29/0619* (2013.01); *H01L 29/0615* (2013.01); *H01L 29/0661* (2013.01);
(Continued)

(58) Field of Classification Search
CPC .............. H01L 29/0619; H01L 29/872; H01L 29/0661
(Continued)

(56) References Cited

U.S. PATENT DOCUMENTS 5,086,332 A * 2/1992 Nakagawa ............ H01L 29/405
257/380
2007/0246791 A1* 10/2007 Schulze .............. H01L 29/0615
257/495

(Continued)

FOREIGN PATENT DOCUMENTS

CN 101262015 9/2008
EP 0 849 807 6/1998
(Continued)

OTHER PUBLICATIONS

Treu et al., "A Surge Current Stable and Avalanche Rugged SIC Merged pn Schottky Diode Blocking 600V Especially Suited for PFC Applications," *Materials Science Forum*, 2006, vols. 527-529, pp. 1155-1158.

(Continued)

*Primary Examiner* — Matthew E Warren
(74) *Attorney, Agent, or Firm* — Nixon & Vanderhye P.C.

(57) ABSTRACT

It is an objective to improve reverse surge withstand capability of a semiconductor device, for example, a Schottky barrier diode.
A p-type semiconductor section 14 includes a p+ type semiconductor portion (first concentration portion) 14a and a p− type semiconductor portion (second concentration portion) 14b, which have different impurity concentrations from each other. Additionally, a part of a side surface 13S of a metal portion 13 and a part of a bottom surface 13B of the metal portion 13 connected to the side surface 13S thereof are in contact with a part of the p+ type semiconductor portion 14a. Further, at least a part of a side surface 14bS of the p− type semiconductor portion 14b is in contact with a side surface 14aS of the p+ type semiconductor portion 14a.

3 Claims, 12 Drawing Sheets

(51) Int. Cl.
*H01L 29/872* (2006.01)
*H01L 29/16* (2006.01)

(52) U.S. Cl.
CPC ............ *H01L 29/36* (2013.01); *H01L 29/872* (2013.01); *H01L 29/1608* (2013.01)

(58) Field of Classification Search
USPC ........................................ 257/409, 483, 484
See application file for complete search history.

(56) References Cited

U.S. PATENT DOCUMENTS

| | | | |
|---|---|---|---|
| 2008/0217725 A1 | 9/2008 | Tu et al. | |
| 2009/0098719 A1 | 4/2009 | Matsuno et al. | |
| 2009/0294891 A1 | 12/2009 | Niwa | |
| 2011/0233713 A1* | 9/2011 | Son | H01L 29/0692 257/476 |
| 2012/0302051 A1* | 11/2012 | Matsuno | H01L 29/1608 438/571 |

FOREIGN PATENT DOCUMENTS

| | | |
|---|---|---|
| JP | 58-58774 | 4/1983 |
| JP | 11-17197 | 1/1999 |
| JP | 2002-334998 | 11/2002 |
| JP | 2009-094392 | 4/2009 |
| JP | 2009-289824 | 12/2009 |
| KR | 10-2009-0016252 | 2/2009 |

OTHER PUBLICATIONS

International Search Report issued in Application No. PCT/JP2013/058493 dated Jun. 18, 2013 (w/ translation).

International Preliminary Report on Patentability issued in PCT/JP2013/058493 dated Dec. 22, 2014 (w/ translation).

Chinese Office Action issued in App. No. 201380074407.2 dated Mar. 10, 2017 (w/ translation).

* cited by examiner

PRIOR ART

US 9,653,539 B2

SEMICONDUCTOR DEVICE

This application is the U.S. national phase of International Application No. PCT/JP2013/058493 filed 25 Mar. 2013, which designated the U.S., the entire contents of which is hereby incorporated by reference.

TECHNICAL FIELD

The present invention relates to a semiconductor device and, more particularly, relates to a technique for improving reverse surge withstand capabilities of diodes.

BACKGROUND ART

A diode, which is an example of a semiconductor device, such as a Schottky barrier diode (hereinafter, occasionally referred to as an SBD), is a semiconductor device using rectifying action of a Schottky barrier at a Schottky junction between a semiconductor layer and a metal layer. SBDs can operate at a higher speed than general pn-junction diodes, and have characteristics in that a forward voltage drop is small.

For example, in a switching power supply provided with such an SBD, when emergency stop is performed in an emergency, a reverse voltage applied from the n-type semiconductor layer toward the metal layer exceeds a breakdown voltage limit (reverse breakdown voltage characteristics) of the SBD in some cases. There is a concern that if the reverse voltage exceeds the breakdown voltage limit, the characteristics of the SBD deteriorate.

FIG. 8 is a cross-sectional view showing an example of a conventional Schottky barrier diode. A Schottky barrier diode 1 shown in FIG. 8 includes, for example, a semiconductor substrate 2 that is an n-type semiconductor. The semiconductor substrate 2 is configured with, for example, SiC (silicon carbide). In a portion, on one surface 2a side, of the semiconductor substrate 2, a guard ring 6 made of a p-type semiconductor is formed. The guard ring 6 is exposed on the one main surface 2a side of the semiconductor substrate 2, and is formed to a predetermined depth toward the thickness direction of the semiconductor substrate 2. Additionally, a metal layer 3 is formed on the one main surface 2a side of the semiconductor substrate 2 so as to be electrically connected to a part of the guard ring 6. A part of a bottom surface 3a of the metal layer 3 is in contact with the guard ring 6, and the other part of the metal layer 3 is in contact with the one main surface 2a. Thus, the metal layer 3 forms a Schottky junction with the semiconductor substrate 2.

The guard ring 6 includes a p+ type semiconductor portion 6a and a p− type semiconductor portion 6b which have different impurity concentrations from each other. The p− type semiconductor portion 6b is formed so as to cover side and bottom surfaces of the p+ type semiconductor portion 6a. Additionally, a part of the exposed portion of the p+ type semiconductor portion 6a which is on the one main surface 2a side of the semiconductor substrate 2, and a part of the exposed portion of the p− type semiconductor portion 6b which is on the one main surface 2a side of the semiconductor substrate 2, are in contact with a part of the bottom surface 3a of the metal layer 3.

This makes it possible to improve the reverse breakdown voltage characteristics of the junction between the metal layer 3 and the semiconductor substrate 2.

Here, as another configuration different from that of the diode shown in FIG. 8, for example, there is a Schottky barrier diode shown in Non-Patent Document 1. In this Non-Patent Document 1, there is a description about an improvement of reverse surge withstand capability.

CITATION LIST

Non-Patent Document

[Non-Patent Document 1] Material Science Forum Vols. 527-529 (2006), pp 1155-1158

DISCLOSURE OF THE INVENTION

Problems to be Solved by the Invention

However, it is conceivable to improve reverse surge withstand capability by a configuration different from that disclosed in Non-Patent Document 1.

The present invention has an object to improve the reverse surge withstand capability of the Schottky junction in a semiconductor device, such as a Schottky barrier diode, by a configuration different from the above-described technique.

Means for Solving the Problems

To solve the above problem, a semiconductor device includes at least: a semiconductor substrate of a first conductive type; a first portion of a second conductivity type opposite to the first conductivity type, the first portion being formed in a part, on one main surface side, of the semiconductor substrate; and a second portion with conductivity formed on the one main surface side of the semiconductor substrate so as to be electrically connected to a part of the first portion. The semiconductor device is characterized in that a part of a side surface of the second portion and a bottom surface of the second portion connected to the side surface thereof are in contact with a part of the first portion.

An aspect of the disclosure may be characterized in that in the semiconductor device, the bottom surface of the second portion is positioned lower in level along a thickness direction of the semiconductor substrate than the one main surface of the semiconductor substrate.

An aspect of the disclosure may be characterized in that in the semiconductor device, the bottom of the second portion is in contact with the one main surface of the semiconductor substrate, a part of the first portion is formed so as to further extend upward from the one main surface of the semiconductor substrate, and the side surface of the second portion is in contact with the first portion at a level higher than a level of the one main surface of the semiconductor substrate.

An aspect of the disclosure may be characterized in that in the semiconductor device, the first portion includes a first concentration portion and a second concentration portion which have different impurity concentrations from each other, a part of the side surface of the second portion and a part of the bottom surface of the second portion connected to the side surface thereof are in contact with a part of the first concentration portion, and at least a part of the side surface of the second concentration portion is in contact with a side surface of the first concentration portion.

Effects of the Invention

According to the semiconductor device of the present invention, a part of the side surface of the second portion and the bottom surface thereof connected to the side surface is in contact with a part of the first portion. Thereby, a thickness from the other main surface of the semiconductor substrate to a Schottky junction surface of the Schottky junction between the bottom surface of the second region and the semiconductor substrate is smaller than a thickness from the other main surface of the semiconductor substrate to the one main surface of the semiconductor substrate in which the first portion is formed. Thereby, a resistance value of the semiconductor substrate at the Schottky junction can be made smaller than a resistance value of the portion of the semiconductor substrate where the first portion is formed. Therefore, it is possible to reliably flow surge current toward the Schottky junction with a small resistance value. As a result, it becomes possible to improve the reverse surge withstand capability of the semiconductor device.

MODE FOR CARRYING OUT THE INVENTION

Figure 1:
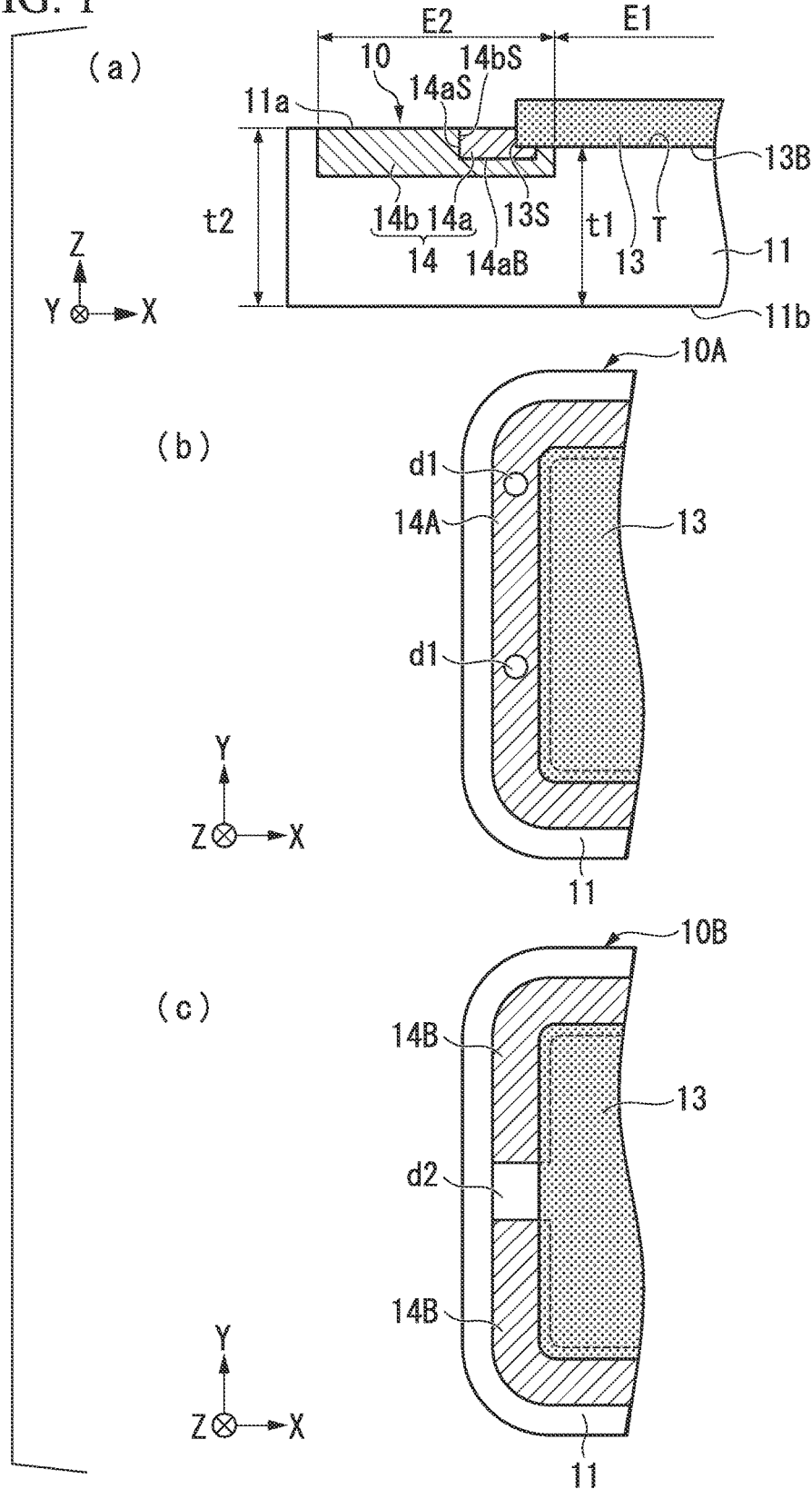
FIG. 1 is a fragmentary enlarged cross-sectional view, and a plan view along a plane direction, in a second embodiment of a Schottky barrier diode that is an example of a semiconductor device according to the present invention.

Next, referring to the drawings, examples as specific examples of embodiments of the present invention will be described. However, the invention is not limited to the following examples.

Additionally, in the following description using the drawings, the drawings are schematic, it should be noted that a ratio or the like of respective dimensions is different from an actual value, and illustration of members other than those necessary for description in order to facilitate understanding is omitted as appropriate. Here, in order to facilitate understanding of the following description, in the drawings, a Z-axis direction is defined as a cross-sectional thickness direction of a diode, and an X-axis and a Y-axis are defined as planar directions vertical to the Z-axis direction.

First, regarding a Schottky barrier diode taken as an example of a semiconductor device described in the present embodiment, an outline of the overall configuration is described. Regarding the Schottky barrier diode, a metal layer (barrier metal) is formed on one main surface of a semiconductor substrate made of, for example, an n− type semiconductor. This metal layer forms a Schottky junction with the semiconductor substrate. A guard ring is provided so as to annularly surround a peripheral portion of the metal layer.

Hereinafter, a semiconductor device having an internal structure of the guard ring, which is a feature of the present invention, will be described in detail with reference to the drawings.

A Schottky barrier diode, taken as an example of the semiconductor device of the present invention described below, will be described with respect to one configuration, taken as an example from the entire configuration of the above-described Schottky barrier diode, which is the configuration in a peripheral region of the Schottky barrier diode including a guard ring (p-type RESURF layer). For this reason, there is no particular limitation to a configuration on a more central side than the peripheral region.

(1) First Embodiment of Schottky Junction

Figure 14:
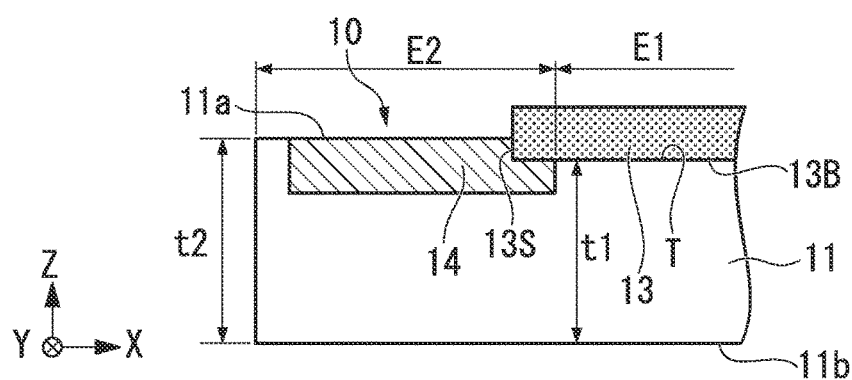
FIG. 14 is a fragmentary enlarged cross-sectional view in a first embodiment of a Schottky barrier diode that is an example of the semiconductor device according to the present invention.

FIG. 14 is a fragmentary cross-sectional view along the Z-axis direction showing an embodiment of the peripheral region of the Schottky barrier diode that is an example of the semiconductor device according to the present invention.

A Schottky barrier diode (semiconductor device) 10 according to the present embodiment includes at least: a semiconductor substrate 11 (first semiconductor region 12) of n-type (first conductivity type); a p-type semiconductor portion (first portion) 14 of p-type (second conductivity type) opposite to the n-type, which is formed in a part, on the one main surface 11a side, of the semiconductor substrate 11; and a conductive metal portion (second portion) 13 formed on the one main surface 11a side of the semiconductor substrate 11 so as to be electrically connected to a part of the p-type semiconductor portion 14. Additionally, a part of a side surface 13S of the metal portion 13 and a part of a bottom surface 13B thereof connected to the side surface 13S are in contact with a part of the p-type semiconductor portion 14.

More specifically, on the one main surface 11a side at the peripheral portion of the semiconductor substrate 11, the p type semiconductor portion 14 is formed from the one main surface 11a of the semiconductor substrate 11 to a predetermined depth along the thickness direction. Additionally, the metal portion 13 is formed so that the bottom surface 13B thereof is positioned deeper in level in the thickness direction (Z-axis direction) of the semiconductor substrate 11 than the one main surface 11a of the semiconductor substrate 11. Further, a part of the side surface 13S and a part of the bottom surface 13B are in contact with the p-type semiconductor portion 14. In a case where the metal portion 13 is formed so that the bottom surface 13B is positioned deeper in level than the one main surface 11a of the semiconductor substrate 11, for example, a recessed portion T dug in the thickness direction from the one main surface 11a of the semiconductor substrate 11 may be formed over a part of the p type semiconductor region 14 and a part of the semiconductor substrate 11 adjacent to the part of the p type semiconductor region 14. Then, the metal portion 13 may be formed so as to fill the recessed portion T.

The semiconductor substrate 11 is configured with, for example, SiC (silicon carbide). Compared with a Schottky barrier diode configured with a Si (silicon) substrate, a Schottky barrier diode configured with a SiC substrate is characterized by an extremely short reverse recovery time and high-speed switching, and the short reverse recovery time achieves a reduction in switching loss. Further, the reverse recovery time of the Schottky barrier diode configured with the Si substrate becomes longer as the temperature increases. On the other hand, the reverse recovery time of the Schottky barrier diode configured with the SiC substrate is almost constant independently of the temperature, and thus the switching loss is not increased even during high temperature operation.

Here, the semiconductor substrate 11 is not limited to a semiconductor substrate configured with SiC, and may be configured with Si. The present invention is applicable to both a Si substrate and a SiC substrate, but is more useful to be applied to a SiC substrate rather than a Si substrate.

Here, the present embodiment is described with respect to a case where the semiconductor substrate 11 that is an n-type semiconductor forms a Schottky junction with the metal portion 13. However, a configuration may be such that an n− type semiconductor containing an impurity at low concentration is deposited by epitaxial growth or the like, on the one main surface 11a side of the semiconductor substrate 11, so that the n− type semiconductor forms a Schottky junction with the metal portion 13.

The metal portion 13 is formed of a metallic material containing, for example, Al (aluminum), Mo (molybdenum), Ti (titanium), and the like.

According to the Schottky barrier diode 10 shown in FIG. 14, a part of the side surface 13S of the metal portion 13 and a part of the bottom surface 13B connected to the side surface 13S are made in contact with a part of the p-type semiconductor portion 14. Thus, a thickness t1 of the semiconductor substrate 11 in a first region E1 where the bottom surface 13B of the metal portion 13 forms the Schottky junction with the semiconductor substrate 11, which is measured from the other main surface 11b of the semiconductor substrate 11 to the bottom surface 13B of the metal portion 13, is smaller than a thickness t2 of the semiconductor substrate 11 in a second region E2 where the p-type semiconductor portion 14 is formed, which is measured from the other main surface 11b of the semiconductor substrate 11 to the one main surface 11a thereof. Thereby, a resistance value in the first region E1 can be made smaller than a resistance value in the second region E2.

In the conventional Schottky barrier diode, if a depletion layer fully spreads from the Schottky junction between a semiconductor substrate and a metal layer, electric field concentration in a peripheral region of the Schottky barrier diode cannot be relaxed, thus deteriorating the reverse surge withstand capability.

According to the Schottky barrier diode 10 of the present invention having the above-described configuration, however, the resistance value in the first region E1 where the metal portion 13 forms the Schottky junction with the semiconductor substrate 11 can be made smaller than the resistance value in the second region E2 where the p-type semiconductor portion 14 is formed. For this reason, surge current flows toward the Schottky junction with the smaller resistance value. As a result, it becomes possible to improve the reverse surge withstand capability of the Schottky barrier diode 10. If the above-described Schottky barrier diode 10 of the present invention is applied to, for example, a switching power supply, it is possible to prevent functional deterioration of the Schottky barrier diode 10 even when an excessive reverse voltage is generated by an emergency stop performed in an emergency.

(2) Second Embodiment of Schottky Junction

FIG. 1(a) is a fragmentary cross-sectional view along the Z-axis direction showing an embodiment, in a peripheral region, of the Schottky barrier diode that is an example of the semiconductor device according to the present invention. Here, configurations similar to those of the first embodiment shown in FIG. 14 are appended with the same reference numerals.

The Schottky barrier diode 10 according to the present embodiment includes at least: the semiconductor substrate 11 of n-type; the p-type semiconductor portion 14 of p type opposite to the n type, which is formed in a part, on the one main surface 11a side, of the semiconductor substrate 11; and a conductive metal portion 13 formed on the one main surface 11a side of the semiconductor substrate 11.

The p type semiconductor portion 14 includes a p+ type semiconductor portion (first concentration portion) 14a and a p− type semiconductor portion (second concentration portion) 14b which have different impurity concentrations from each other. Additionally, a part of the side surface 13S of the metal portion 13 and a part of the bottom surface 13B thereof connected to the side surface 13S are in contact with a part of the p+ type semiconductor portion 14a. Further, at least a part of a side surface 14bS of the p− type semiconductor portion 14b is in contact with a side surface 14aS of the p+ type semiconductor portion 14a. In the present embodiment, the p− type semiconductor portion 14b covers a bottom surface 14aB of the p+ type semiconductor portion 14a from a lower part of the side surface 14bS, and further extends to a position in contact with the metal portion 13.

Additionally, on the main surface 11a side at the peripheral portion of the semiconductor substrate 11, the p-type semiconductor portion 14 is formed from one main surface 11a side of the semiconductor substrate 11 to a predetermined depth along the thickness direction. Further, the metal portion 13 is formed so that the bottom surface 13B thereof is positioned deeper in level in the thickness direction of the semiconductor substrate 11 than the one main surface 11a of the semiconductor substrate 11. Moreover, a part of the side surface 13S and a part of the bottom surface 13B are in contact with the p+ type semiconductor portion 14a. In a case where the metal portion 13 is formed so that the bottom surface 13B is positioned deeper in level than the one main surface 11a of the semiconductor substrate 11, for example, a recessed portion T dug in the thickness direction from the one main surface 11a of the semiconductor substrate 11 may be formed over a part of the p-type semiconductor region 14 and a part of the semiconductor substrate 11 adjacent to the part of the p-type semiconductor region 14. Then, the metal portion 13 may be formed so as to fill the recessed portion T.

According to the Schottky barrier diode 10 shown in FIG. 1(a), a part of the side surface 13S of the metal portion 13 and a part of the bottom surface 13B thereof connected to the side surface 13S are made in contact with a part of the p+ type semiconductor portion 14a. Thereby, the thickness t1 of the semiconductor substrate 11 in the first region E1 where the bottom surface 13B of the metal portion 13 forms the Schottky junction with the semiconductor substrate 11, which is measured from the other main surface 11b of the semiconductor substrate 11 to the bottom surface 13B of the metal portion 13, is smaller than the thickness t2 of the semiconductor substrate 11 in the second region E2 where the p-type semiconductor portion 14 is formed, which is measured from the other main surface 11b of the semiconductor substrate 11 to the one main surface 11a thereof.

Thus, a resistance value in the first region E1 can be made smaller than a resistance value in the second region E2, and thereby surge current flows toward the Schottky junction with the smaller resistance value. As a result, it becomes possible to improve the reverse surge withstand capability of the Schottky barrier diode 10. Additionally, it is possible to further alleviate the electric field concentration by configuring the p-type semiconductor portion 14 with the p+ type semiconductor portion 14a and the p− type semiconductor portion 14b which have different impurity concentrations from each other.

FIGS. 1(b) and 1(c) are plan views along the planar direction (the X-axis direction and the Y-axis direction) of the Schottky barrier diode. FIGS. 1(b) and 1(c) selectively show a part of the peripheral region of the Schottky barrier diode.

For example, if contamination or the like occurs in the p-type semiconductor portion 14 in a manufacturing process, a region into which impurity ions are not implanted is generated, which might affect the function of the Schottky barrier diode 10. Since a depletion layer spreads during the reverse bias, however, the above effect is relaxed, thereby making it possible to expect an effect of reliably flowing surge current toward the Schottky junction with a smaller resistance value.

Additionally, on the other hand, in order to reduce the disturbance of the crystal structure, it is possible to intentionally prevent impurity ions from being implanted. In other words, for example, like a Schottky barrier diode 10A shown in FIG. 1(b), the semiconductor substrate 11 (see FIG. 1(a)) is provided with non-formation portions d1 where a p+ type semiconductor portion 14A (corresponding to the p+ type semiconductor portion 14a and the p− type semiconductor portion 14b shown in FIG. 1(a)) is not formed, thereby making it possible to reduce the amount of impurity ions to be implanted into the semiconductor substrate 11, and thus making it possible to suppress the disturbance of the crystal structure of the semiconductor substrate 11 caused by the impurity ion implantation. Such the non-formation portions d1 may have any arbitrary shape, such as rectangular, circular, or oval, which is seen from the one main surface 11a of the semiconductor substrate 11.

Additionally, like a Schottky barrier diode 10B shown in FIG. 1(c), in a p-type semiconductor portion 14B (corresponding to the p+ type semiconductor portion 14a and the p− type the semiconductor portion 14b shown in FIG. 1(a)) formed along the peripheral region, on the one main surface 11a side, of the semiconductor substrate 11, one or a plurality of non-formation portions d2 where the semiconductor region 14B is not formed may be formed (FIG. 1(c) shows only one non-formation portion).

Here, in FIG. 1(c), for example, in a case where one non-formation portion d2 is provided at the center of each side of the semiconductor substrate 11 having a substantially rectangular shape in plan view, the circular p-type semiconductor portion 14B is divided into four pieces. It is sufficient to form the non-formation portion d2 at an optional portion of each side of the semiconductor substrate 11. Additionally, the number of pieces into which the p-type semiconductor portion 14B is divided by the non-formation portion d2 is not limited to a particular number. Here, the non-formation portion d2 may be configured so that the p-type semiconductor portion 14B is divided (FIG. 1(c)). Alternatively, the non-formation portion d1 may be configured to be surrounded by the p-type semiconductor portion 14A so that the p-type semiconductor portion 14A is not divided (FIG. 1(b)).

(3) Modified Examples of Second Embodiment of Schottky Junction

Modified examples of the above-described Schottky barrier diode of the second embodiment are shown in FIGS. 2(a) to 2(d). Here, similar configurations to those of the second embodiment shown in FIG. 1 are appended with the same numbers, and a description thereof will be omitted.

Figure 2:
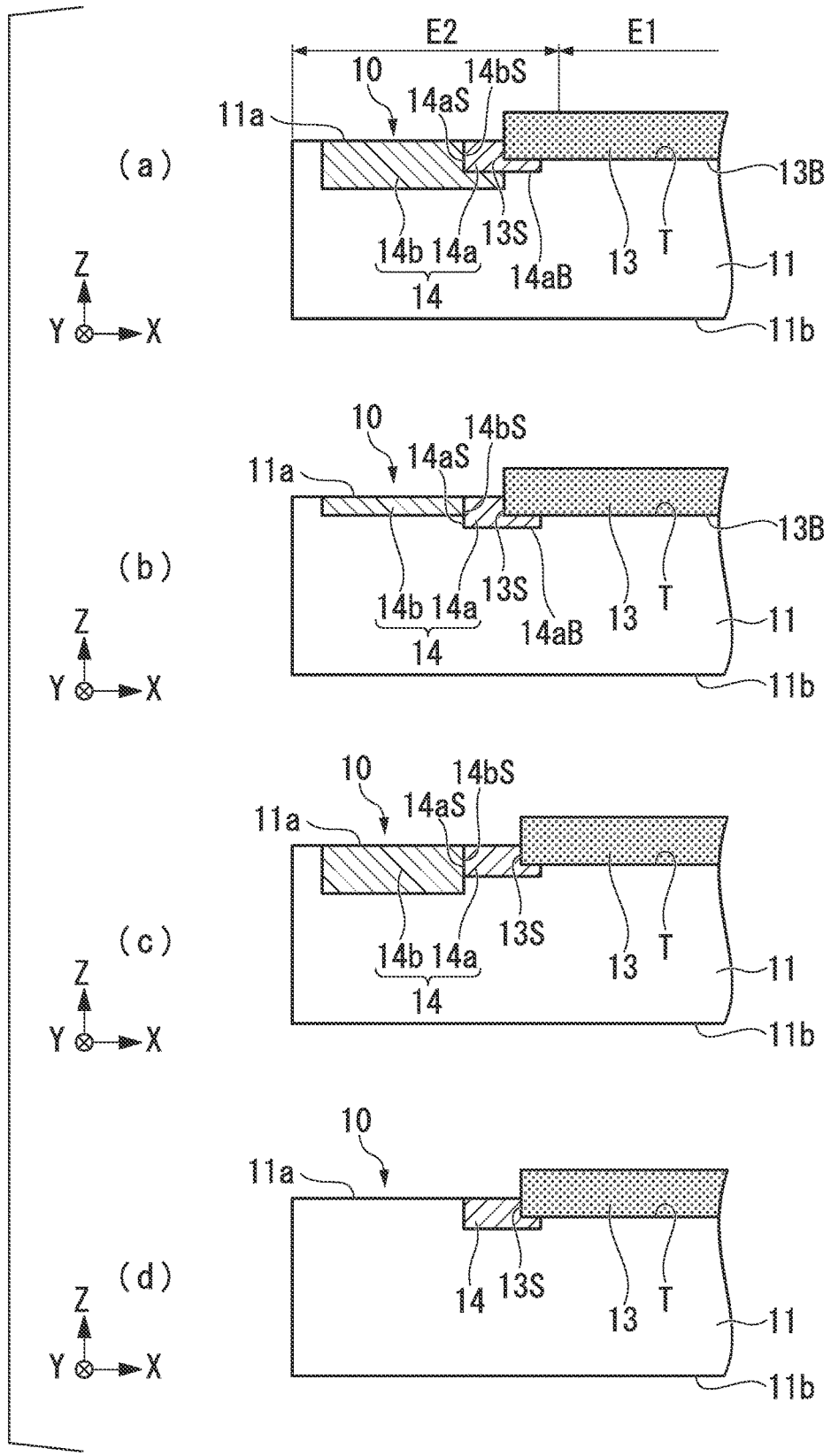
FIG. 2 is a fragmentary enlarged cross-sectional view showing variations of the configuration in the second embodiment of the Schottky barrier diode according to the present invention.

In the Schottky barrier diode 10 shown in FIG. 2(a), a part of the side surface 13S of the metal portion 13 and a part of the bottom surface 13B thereof connected to the side surface 13S are in contact with a part of the p+ type semiconductor portion 14a. Then, the p− type semiconductor portion 14b is configured to cover a part of the bottom surface 14aB of the p+ type semiconductor portion 14a from a lower part of the side surface 14bS thereof, and not to be in contact with the metal portion 13.

In the Schottky barrier diode 10 shown in FIG. 2(b), a part of the side surface 13S of the metal portion 13 and a part of the bottom surface 13B thereof connected to the side surface 13S are in contact with a part of the p+ type semiconductor portion 14a. Additionally, the p− type semiconductor portion 14b is formed in the peripheral portion, on the one main surface 11a side, of the semiconductor substrate 11, to a depth at which the side surface 14bS of the p− type semiconductor portion 14b is in contact with a part of the side surface 14aS of the p+ type semiconductor portion 14a. Meanwhile, the p− type semiconductor portion 14b is configured not to be in contact with the bottom surface 13B of the metal portion 13 and the bottom surface 14aB of the p+ type semiconductor portion 14a. Additionally, the p− type semiconductor portion 14b is formed to be thinner in thickness than the p+ type semiconductor portion 14a.

In the Schottky barrier diode 10 shown in FIG. 2(c), a part of the side surface 13S of the metal portion 13 and a part of the bottom surface 13B thereof connected to the side surface 13S are in contact with a part of the p+ type semiconductor portion 14a. Additionally, the p− type semiconductor portion 14b is formed in the peripheral portion, on the one main surface 11a side, of the semiconductor substrate 11 to a depth at which a part of the side surface 14bS of the p− type semiconductor portion 14b is in contact with a part of the side surface 14aS of the p+ type semiconductor portion 14a. Meanwhile, the p− type semiconductor portion 14b is configured not to be in contact with the bottom surface 13B of the metal portion 13 and the bottom surface 14aB of the p+ type semiconductor portion 14a. Additionally, the p− type semiconductor portion 14b is formed to be thicker in thickness than the p+ type semiconductor portion 14a.

In the Schottky barrier diode 10 shown in FIG. 2(d), the p-type semiconductor portion 14 is formed in a part, on the one main surface 11a side, of the semiconductor substrate 11. The p-type semiconductor portion 14 is formed so as not to be in contact with the periphery of the semiconductor substrate 11. Additionally, a part of the side surface 13S of the metal portion 13 and a part of the bottom surface 13B thereof connected to the side surface 13S are in contact with a part of the p-type semiconductor portion 14.

(3) Third Embodiment of Schottky Junction

Figure 3:
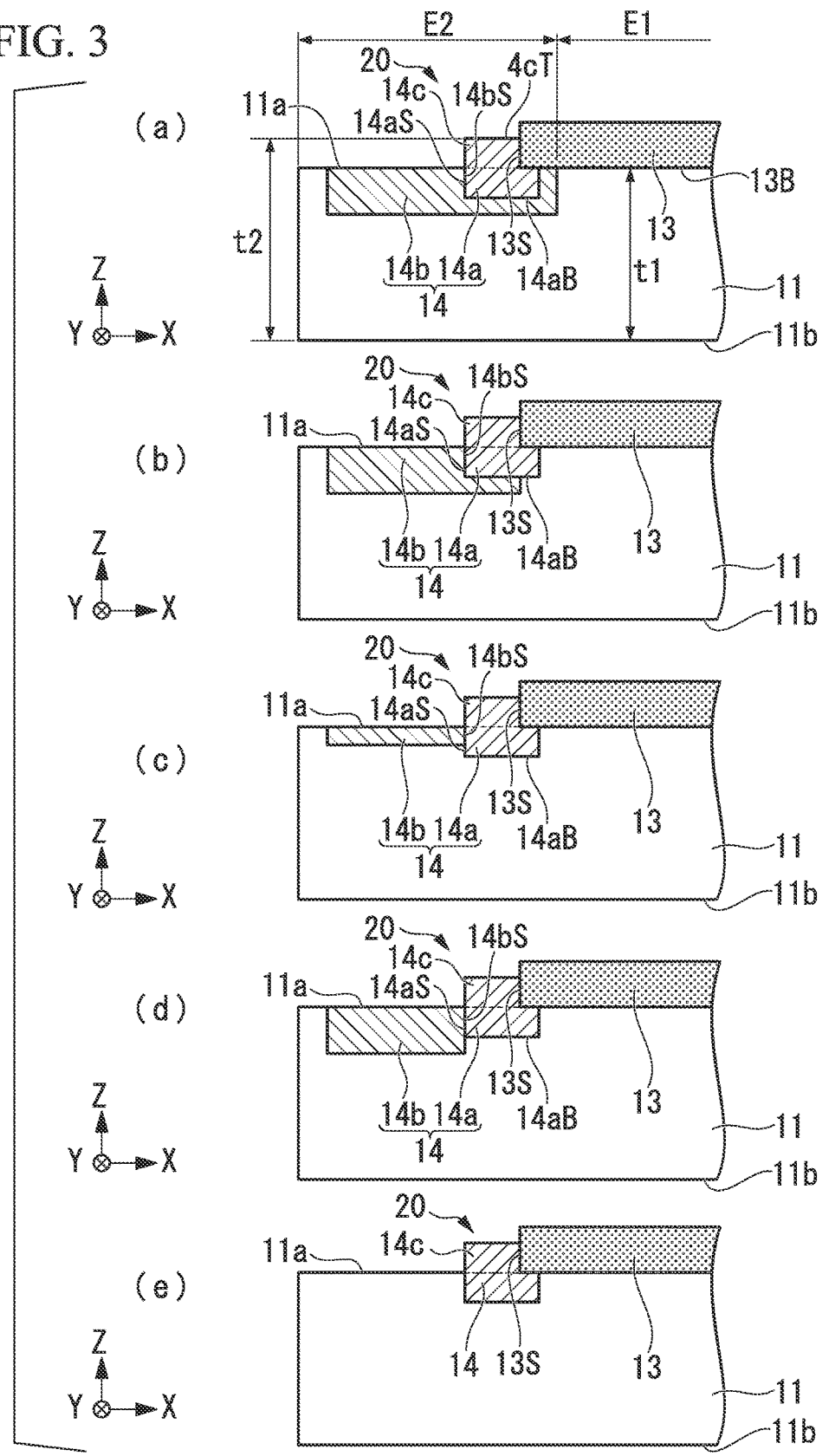
FIG. 3 is a fragmentary enlarged cross-sectional view in a third embodiment of the Schottky barrier diode according to the present invention.

Next, referring to FIG. 3(a), a Schottky barrier diode according to a third embodiment is described. Here, the same components as those of the above-described Schottky barrier diode according to the second embodiment are appended with the same reference numerals, and a detailed description thereof will be omitted.

A Schottky barrier diode 20 shown in FIG. 3(a) has a configuration, a part of which is the same as that of the Schottky barrier diode 20 shown in FIG. 1(a), but which differs therefrom only in a configuration of the p+ type semiconductor portion 14a. A part of the p-type semiconductor portion 14, that is, a p-type semiconductor deposition portion 14c, is formed so as to further extend upward (in the Z-axis direction from the one main surface 11a, which is opposite to the direction toward the other main surface 11b) from the one main surface 11a of the semiconductor substrate 11 where the p-type semiconductor portion 14 is formed, to a level of a part of the side surface 13S of the metal portion 13. Additionally, a part of the side surface 13S of the metal portion 13 is configured to be in contact with the p-type semiconductor deposition portion 14c at a level higher than the level of the one main surface 11a of the semiconductor substrate 11.

The p-type semiconductor deposition portion 14c is formed by, for example, depositing a p+ type semiconductor by epitaxial growth or the like so as to overlap a region of the p+ type semiconductor portion 14a on the one main surface 11a side of the semiconductor substrate 11, which is not in contact with the metal portion 13. The side surface 13S of the metal portion 13 is in contact with the p-type semiconductor deposition portion 14c.

According to the Schottky barrier diode 20 having the above-described configuration of the third embodiment, a part of the side surface 13S of the metal portion 13 and a part of the bottom surface 13B thereof are made in contact with a part of the p-type semiconductor deposition portion 14c that is a part of the p-type semiconductor portion 14. Additionally, a part of the bottom surface 13B of the metal portion 13 connected to the side surface 13S thereof is made in contact with a part of the p+ type semiconductor portion 14a. Thereby, the thickness t1 of the semiconductor substrate 11 in the first region E1 where the bottom surface 13B of the metal portion 13 forms the Schottky junction with the semiconductor substrate 11, which is measured from the other main surface 11b of the semiconductor substrate 11 to the bottom surface 13B of the metal portion 13, is smaller than the thickness t2 that is a sum of the thicknesses of the p-type semiconductor deposition portion 14c and the semiconductor substrate 11 in the second region E2 where the p-type semiconductor portion 14 is formed, which is measured from the other main surface 11b of the semiconductor substrate 11 to an upper surface 14cT of the p-type semiconductor deposition portion 14c. Thus, a resistance value in the first region E1 can be made smaller than a resistance value in the second region E2.

The resistance value in the first region E1 is made smaller than the resistance value in the second region E2, and thereby surge current flows toward the Schottky junction with the smaller resistance value. As a result, it becomes possible to improve the reverse surge withstand capability of the Schottky barrier diode 20.

(4) Modified Examples of Schottky Junction

Modified examples of the above-described Schottky barrier diode of the third embodiment are shown in FIGS. 3(b) to 3(e). Here, similar configurations to those of the third embodiment shown in FIG. 3(a) are appended with the same reference numerals, and a description thereof will be omitted.

In the Schottky barrier diode 20 shown in FIG. 3(b), a part of the side surface 13S of the metal portion 13 is in contact with a part of the p-type semiconductor deposition portion 14c. Additionally, a part of the bottom surface 13B of the metal portion 13 connected to the side surface 13S thereof is in contact with a part of the p+ type semiconductor portion 14a. Further, the p− type semiconductor portion 14b is configured to cover a part of the bottom surface 14aB of the p+ type semiconductor portion 14a from a lower part of the side surface 14bS thereof, and not to be in contact with the metal portion 13.

In the Schottky barrier diode 20 shown in FIG. 3(c), a part of the side surface 13S of the metal portion 13 is in contact with a part of the p-type semiconductor deposition portion 14c. Additionally, a part of the bottom surface 13B of the metal portion 13 connected to the side surface 13S thereof is in contact with a part of the p+ type semiconductor portion 14a. Further, the p− type semiconductor portion 14b is formed from the one main surface 11a side, in the peripheral portion, of the semiconductor substrate 11 to a depth at which the side surface 14bS of the p− type semiconductor portion 14b is in contact with a part of the side surface 14aS of the p+ type semiconductor portion 14a. Meanwhile, the p− type semiconductor portion 14b is configured not to be in contact with the bottom surface 13B of the metal portion 13 and the bottom portion 14aB of the p+ type semiconductor portion 14a. Additionally, the p− type semiconductor portion 14b is formed to be thinner in thickness than the p+ type semiconductor portion 14a.

In the Schottky barrier diode 20 shown in FIG. 3(d), a part of the side surface 13S of the metal portion 13 is in contact with a part of the p-type semiconductor deposition portion 14c. Additionally, a part of the bottom surface 13B of the metal portion 13 connected to the side surface 13S thereof is in contact with a part of the p+ type semiconductor portion 14a. Further, the p− type semiconductor portion 14b is formed from the one main surface 11a side, in the peripheral portion, of the semiconductor substrate 11 to a depth at which a part of the side surface 14bS of the p− type semiconductor portion 14b is in contact with the side surface 14aS of the p+ type semiconductor portion 14a. Meanwhile, the p− type semiconductor portion 14b is configured not to be in contact with the bottom surface 13B of the metal portion 13 and the bottom portion 14aB of the p+ type semiconductor portion 14a. Additionally, the p− type semiconductor portion 14b is formed to be thicker in thickness than the p+ type semiconductor portion 14a.

In the Schottky barrier diode 20 shown in FIG. 3(e), the p-type semiconductor portion 14 is formed in a part, on the one main surface 11a side, of the semiconductor substrate 11. The p-type semiconductor portion 14 is formed so as not to be in contact with the periphery of the semiconductor substrate 11. Additionally, a p+ type semiconductor is deposited over the p-type semiconductor portion 14, thereby forming a p-type semiconductor deposition portion 14c.

(5) Other Embodiments of Schottky Junction

Hereinafter, several modified examples of the Schottky junction of the Schottky barrier diode that is an example of the semiconductor device according to the present invention will be illustrated, but the present invention is not limited to those embodiments. Here, the same components as those of the above-described Schottky barrier diodes according to the first embodiment, the second embodiment, and the third embodiment, are appended with the same reference numerals, and a detailed description thereof will be omitted.

Figure 9:
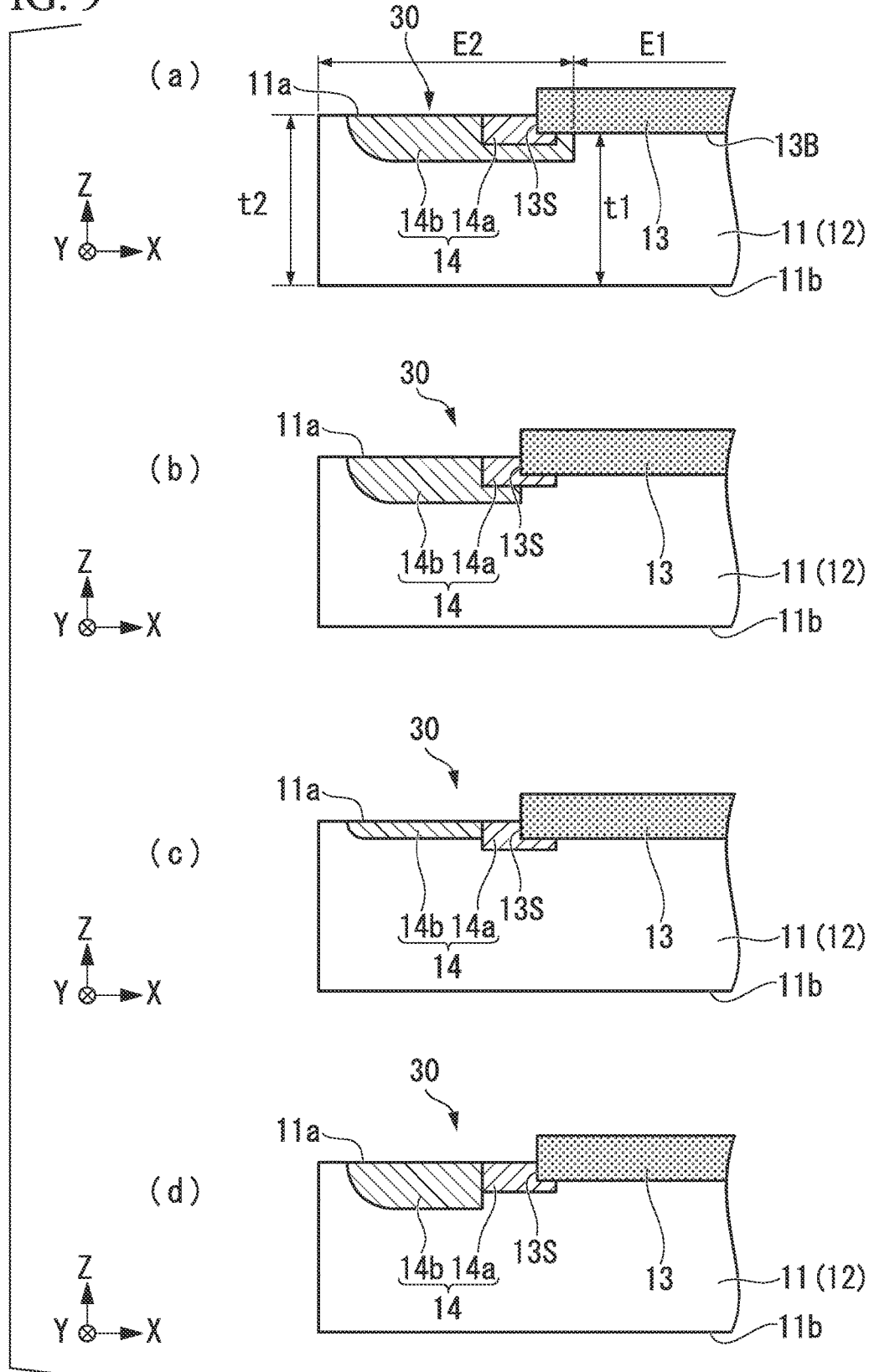
FIG. 9 is a fragmentary enlarged cross-sectional view of a peripheral region of another embodiment of the Schottky barrier diode according to the present invention.

A Schottky barrier diode 30 shown in FIG. 9(a) has a configuration, a part of which is the same as that of the Schottky barrier diode 10 shown in FIG. 1(a). In the Schottky barrier diode 30, an end portion (edge portion) of the p− type semiconductor portion 14b constituting the p-type semiconductor portion 14, on the peripheral side of the semiconductor substrate 11 along the X-axis direction, is configured to be gradually reduced in thickness toward the peripheral side of the semiconductor substrate 11 so as to be rounded.

A Schottky barrier diode 30 shown in FIG. 9(b) has a configuration, a part of which is the same as that of the Schottky barrier diode 30 shown in FIG. 9(a). The Schottky barrier diode 30 has a configuration such that a portion of the p+ type semiconductor portion 14a, which is not covered by the p− type semiconductor portion 14b and which overlaps the metal portion 13, is in contact with a first semiconductor region 12.

A Schottky barrier diode 30 shown in FIG. 9(c) has a configuration, a part of which is the same as that of the Schottky barrier diode 30 shown in FIG. 9(a). In the Schottky barrier diode 30, the entire bottom surface of the p+ type semiconductor portion 14a is in contact with the first semiconductor region 12, and the p− type semiconductor portion 14b is thinner in thickness than the p+ type semiconductor portion 14a.

A Schottky barrier diode 30 shown in FIG. 9(d) has a configuration, a part of which is the same as that of the Schottky barrier diode 30 shown in FIG. 9(a). In the Schottky barrier diode 30, the entire bottom surface of the p+ type semiconductor portion 14a is in contact with the first semiconductor region 12, and the p− type semiconductor portion 14b is thicker in thickness than the p+ type semiconductor portion 14a.

Figure 10:
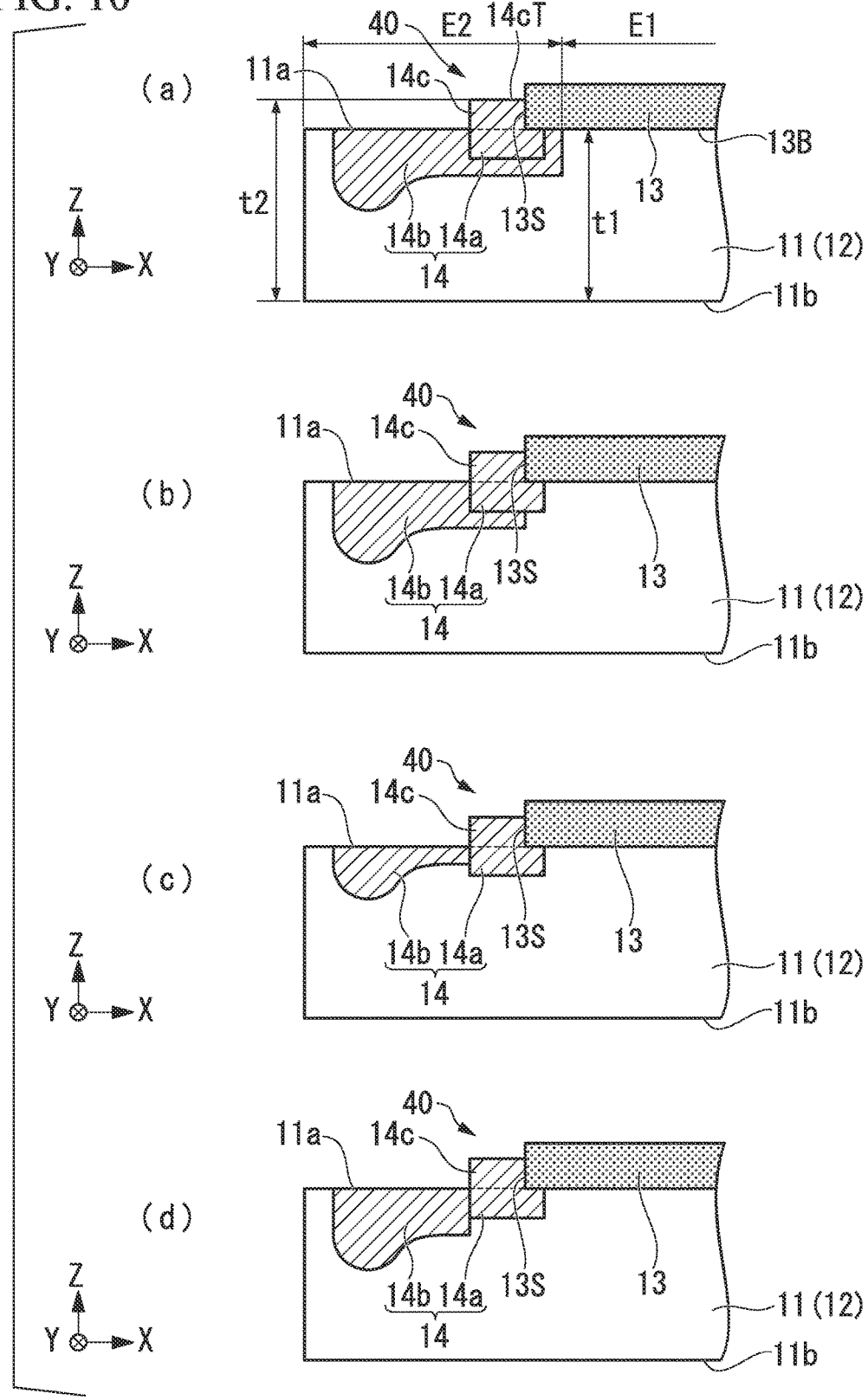
FIG. 10 is a fragmentary enlarged cross-sectional view of a peripheral region of another embodiment of the Schottky barrier diode according to the present invention.

A Schottky barrier diode 40 shown in FIG. 10(a) has a configuration, a part of which is the same as that of the Schottky barrier diode 20 shown in FIG. 3(a). A difference therebetween is as follows. In other words, in the Schottky barrier diode 40, an end portion (edge portion) of the p− type semiconductor portion 14b constituting the p-type semiconductor portion 14, on the peripheral side of the semiconductor substrate 11 along the X-axis direction, is configured to be inflated so as to be rounded toward a position spaced a predetermined distance away from the periphery of the semiconductor substrate 1, and thus to be increased in thickness.

A Schottky barrier diode 40 shown in FIG. 10(b) has a configuration, a part of which is the same as that of the Schottky barrier diode 40 shown in FIG. 10(a). The Schottky barrier diode 40 has a configuration such that a portion of the p+ type semiconductor portion 14a, which is not covered by the p− type semiconductor portion 14b and which overlaps the metal portion 13, is in contact with the first semiconductor region 12

A Schottky barrier diode 40 shown in FIG. 10(c) has a configuration, a part of which is the same as that of the Schottky barrier diode 40 shown in FIG. 10(a). In the Schottky barrier diode 40, the entire bottom surface of the p+ type semiconductor portion 14a is in contact with the first semiconductor region 12, and the p− type semiconductor portion 14b is thinner in thickness than the p+ type semiconductor portion 14a.

A Schottky barrier diode 40 shown in FIG. 10(d) has a configuration, a part of which is the same as that of the Schottky barrier diode 40 shown in FIG. 10(a). In the Schottky barrier diode 40, the entire bottom surface of the p+ type semiconductor portion 14a is in contact with the first semiconductor region 12, and the p− type semiconductor portion 14b is thicker in thickness than the p+ type semiconductor portion 14a.

Figure 11:
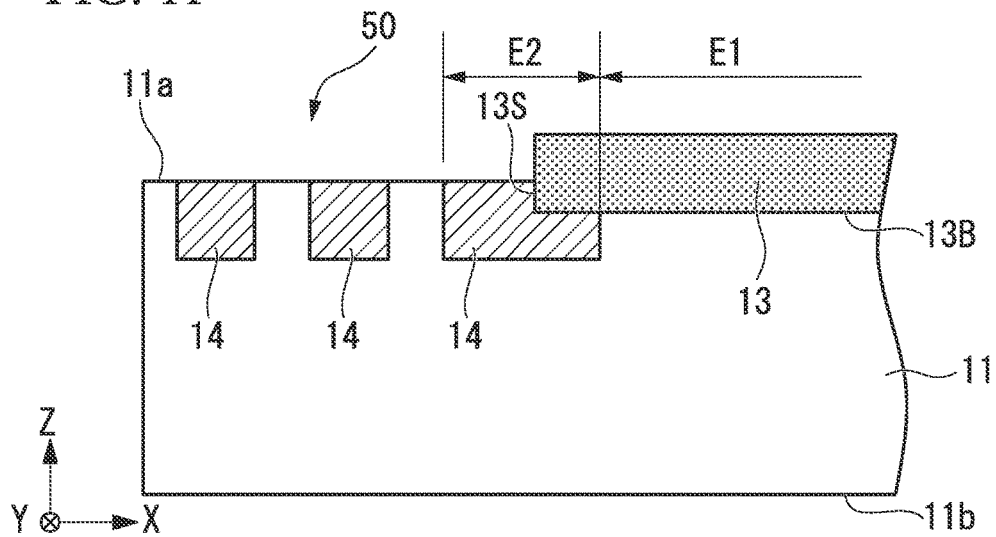
FIG. 11 is a fragmentary enlarged cross-sectional view of a peripheral region of another embodiment of the Schottky barrier diode according to the present invention.

A Schottky barrier diode 50 shown in FIG. 11 has a configuration such that a plurality of p-type semiconductor portions 14 are further added to the configuration of the Schottky barrier diode 10 in FIG. 2(d). In other words, the added p-type semiconductor portions 14 are arranged separately from one another so as to annularly surround the peripheral portion of the metal portion 13, at positions on the peripheral side of the semiconductor substrate 11, which are exterior to the position of the p-type semiconductor portion 14 in contact with the meal portion 13.

Figure 12:
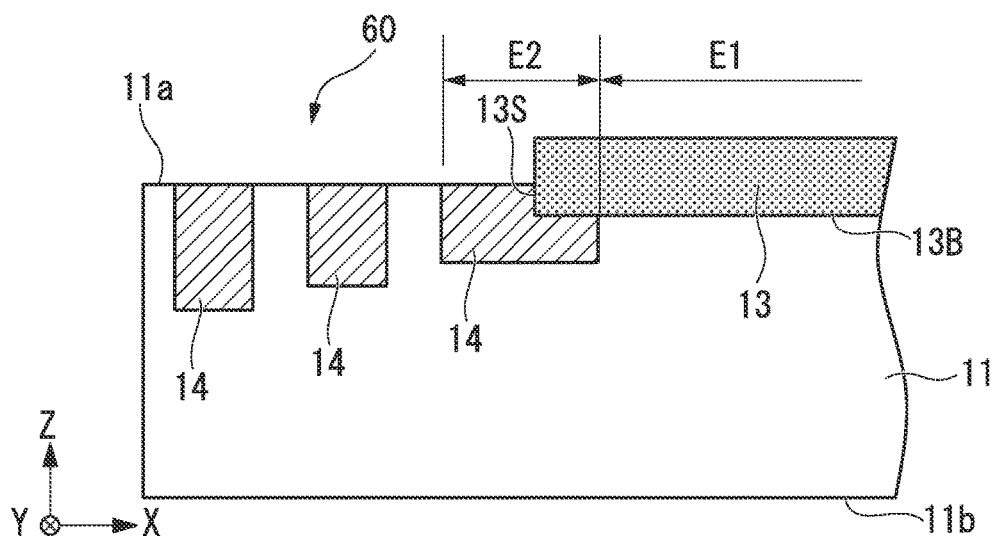
FIG. 12 is a fragmentary enlarged cross-sectional view of a peripheral region of another embodiment of the Schottky barrier diode according to the present invention.

A Schottky barrier diode 60 shown in FIG. 12 has a configuration such that among the plurality of p-type semiconductor portions 14 shown in FIG. 11, a p-type semiconductor portion 14 closer to the periphery of the semiconductor substrate 11 has a larger thickness along the Z-axis direction.

Figure 13:
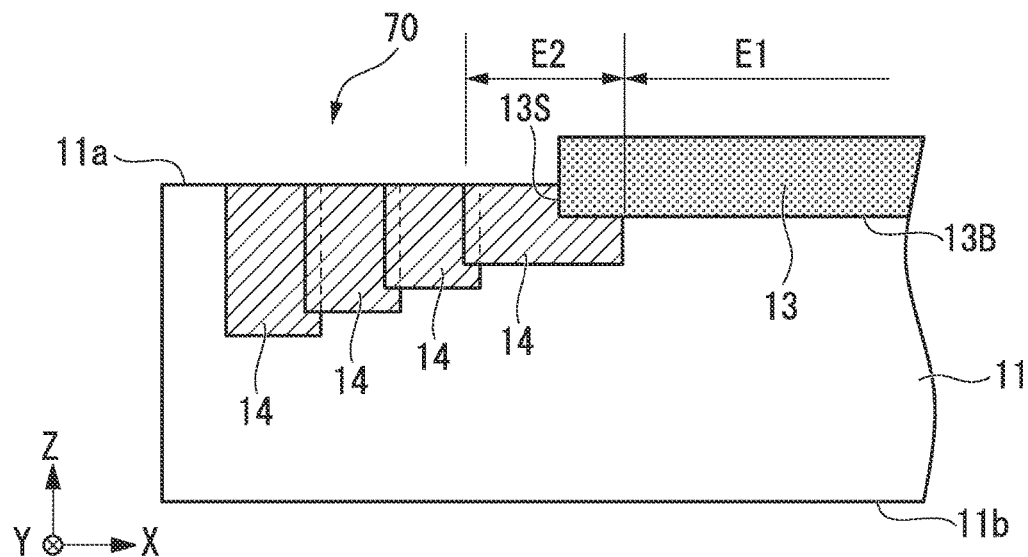
FIG. 13 is a fragmentary enlarged cross-sectional view of a peripheral region of another embodiment of the Schottky barrier diode according to the present invention.

In a Schottky barrier diode 70 shown in FIG. 13, among the plurality of p-type semiconductor portions 14 shown in FIG. 12, a p-type semiconductor portion 14 closer to the periphery of the semiconductor substrate 11 has a larger thickness along the Z-axis direction. Further, each of the p-type semiconductor portions 14 is provided with a non-formation portion where the p-type semiconductor portion is not formed. The non-formation portion of each p-type semiconductor portion 14 is formed so as to divide a part of the annular p-type semiconductor portion 14 in the circumferential direction. The non-formation portions of the respective p-type semiconductor portions 14 are formed at different positions on the Y-axis direction. Moreover, the p-type semiconductor portions 14 are arranged so that any two adjacent p-type semiconductor portions 14 overlap each other along the Y-axis direction.

EXAMPLES

Hereinafter, examples in which the effects of the present invention were verified are shown in comparison with the conventional examples.

In the present verification, as an indication of reverse surge withstand capability, a current flow and a temperature increase in the peripheral region of the substrate in a case where the PRSM test was performed are simulated.

Figure 4:
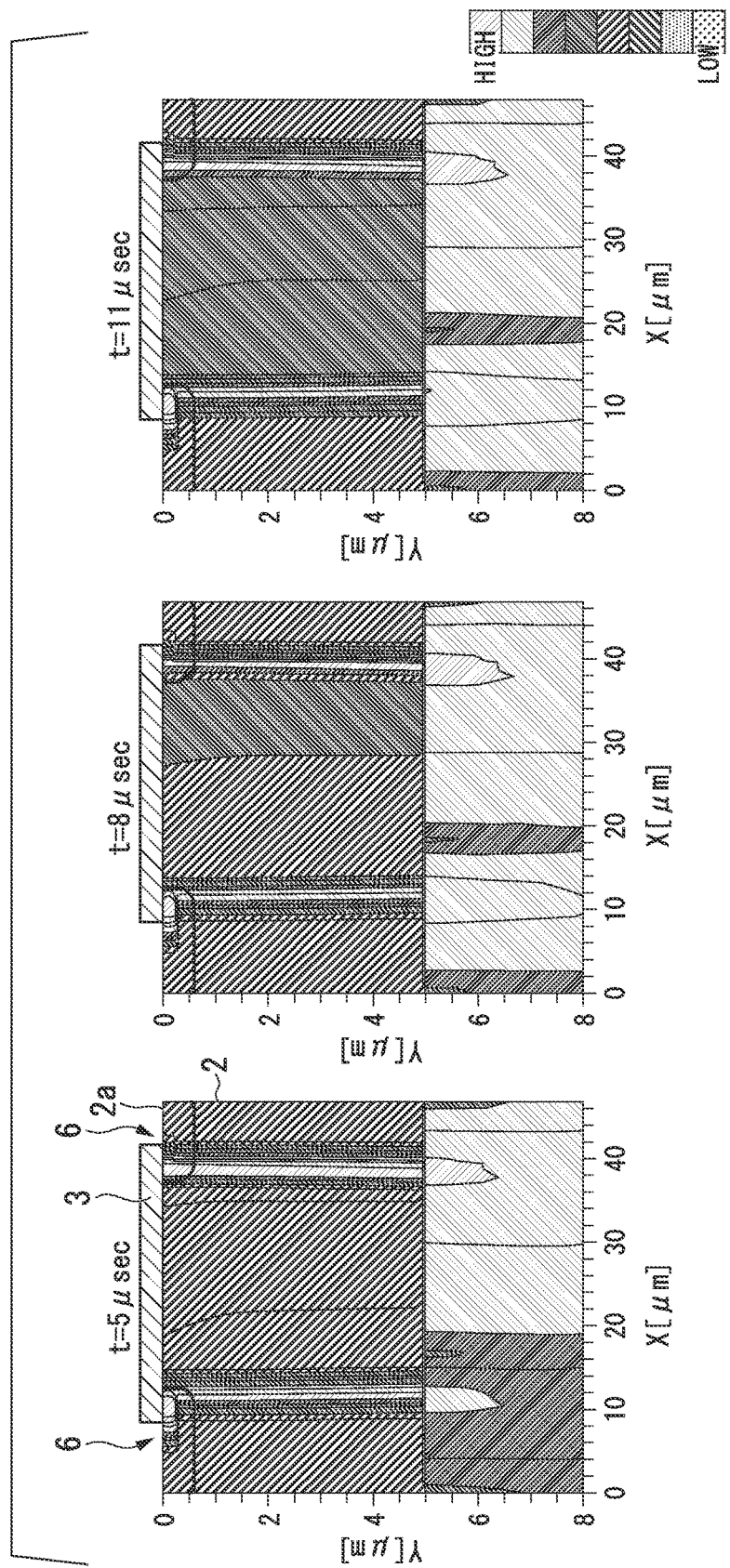
FIG. 4 is a distribution diagram of a current flow and a temperature increase in a peripheral region of a substrate in a case where a PRSM (rated surge reverse power) test is performed on a conventional JBS (junction barrier Schottky) diode.
Figure 5:
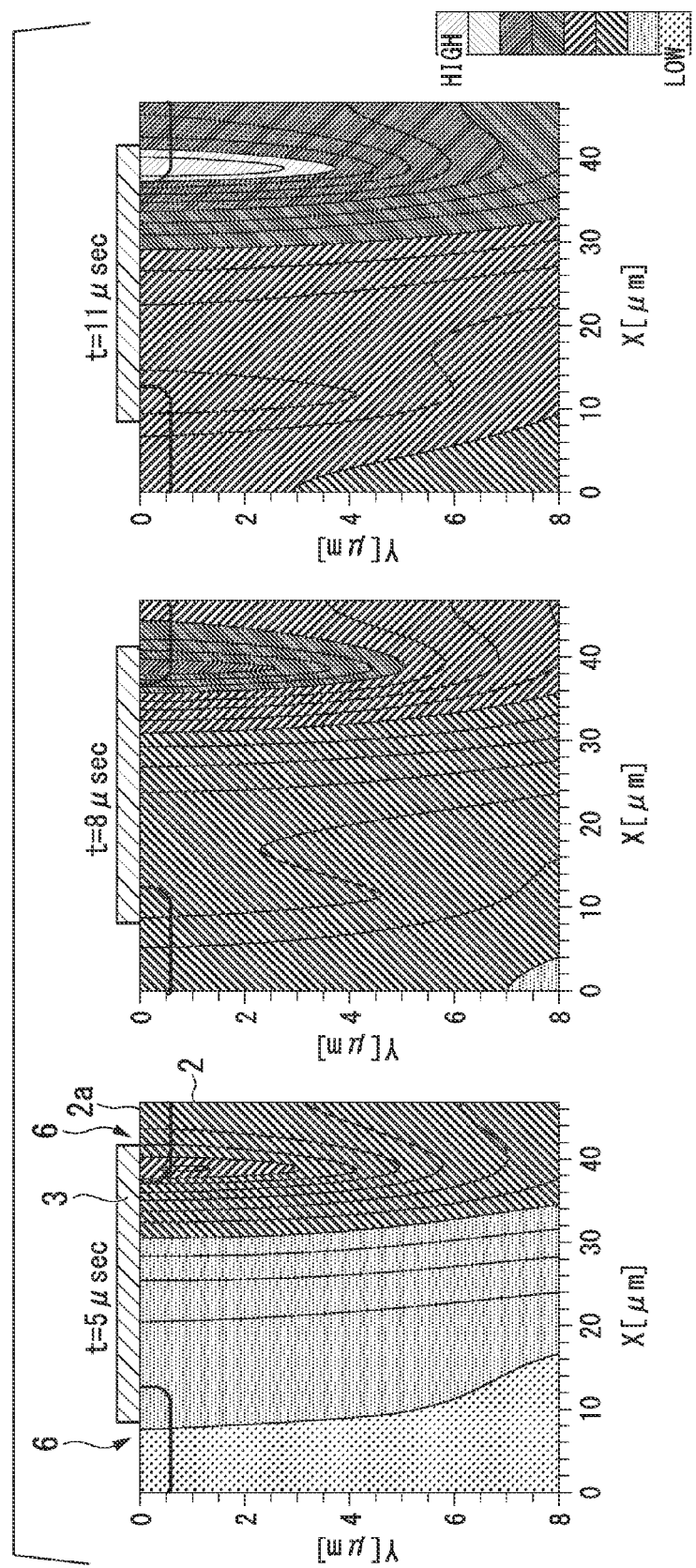
FIG. 5 is a distribution diagram of a current flow and a temperature increase in the peripheral region of the substrate in a case where the PRSM test is performed on the conventional JBS diode.
Figure 8:
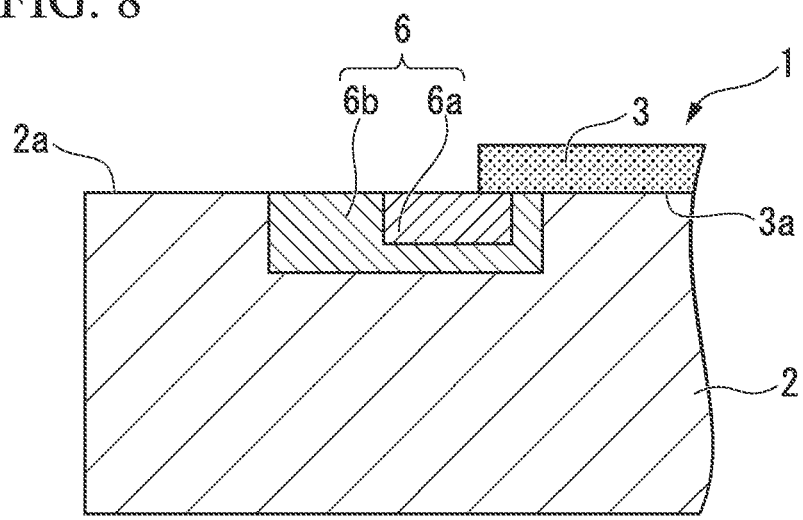
FIG. 8 is a cross-sectional view showing an example of a conventional Schottky barrier diode.

FIGS. 4 and 5 are distribution diagrams showing a current flow in the peripheral region of the substrate (FIG. 4) and a distribution of a temperature increase (FIG. 5) along with the elapsed time (5 μsec, 8 μsec, 20 μsec) in a case where the PRSM test was performed on the Schottky barrier diode having the conventional JBS structure shown in FIG. 8 as a conventional example.

In the distribution diagrams shown in FIGS. 4 and 5, the metal layer 3 is shown in the upper center, and the guard ring 6 is shown on both sides of the metal layer 3. The Schottky barrier diode shown in FIGS. 4 and 5 corresponds to the conventional Schottky barrier diode shown in FIG. 8.

According to the results of the simulation shown in FIGS. 4 and 5, even after 5 μsec, 8 μsec, and 11 μsec elapsed from the start of the test, the current flow did not spread throughout the Schottky junction surface in the X-axis and Y-axis directions, and was concentrated on the portion where the guard ring 6 is formed (FIG. 4). Additionally, since the current flow does not spread throughout the entire Schottky junction surface in the X-axis and Y-axis directions, as the time 5 μsec, 8 μsec, and 11 μsec elapsed from the start of the test, the temperature of the semiconductor substrate in the vicinity of the guard ring 6 increased significantly by the concentration of current (FIG. 5). The temperature of the semiconductor substrate in the vicinity of the guard ring 6 became 600 to 700° C. at the highest part.

Here, the rated surge reverse power was 0.1 kw to 0.2 kw.

Figure 6:
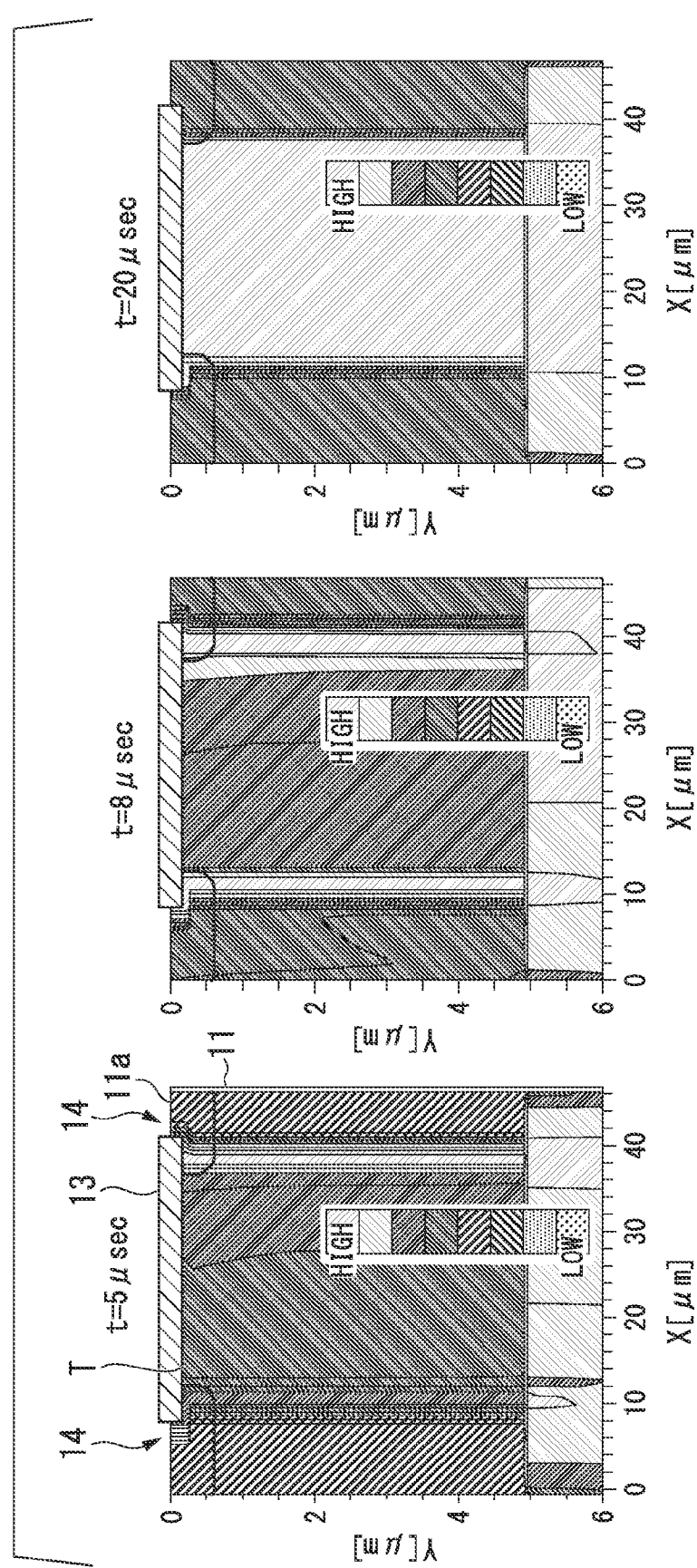
FIG. 6 is a distribution diagram of a current flow and a temperature increase in a peripheral region of a substrate in a case where the PRSM test is performed on the Schottky barrier diode according to the present invention.
Figure 7:
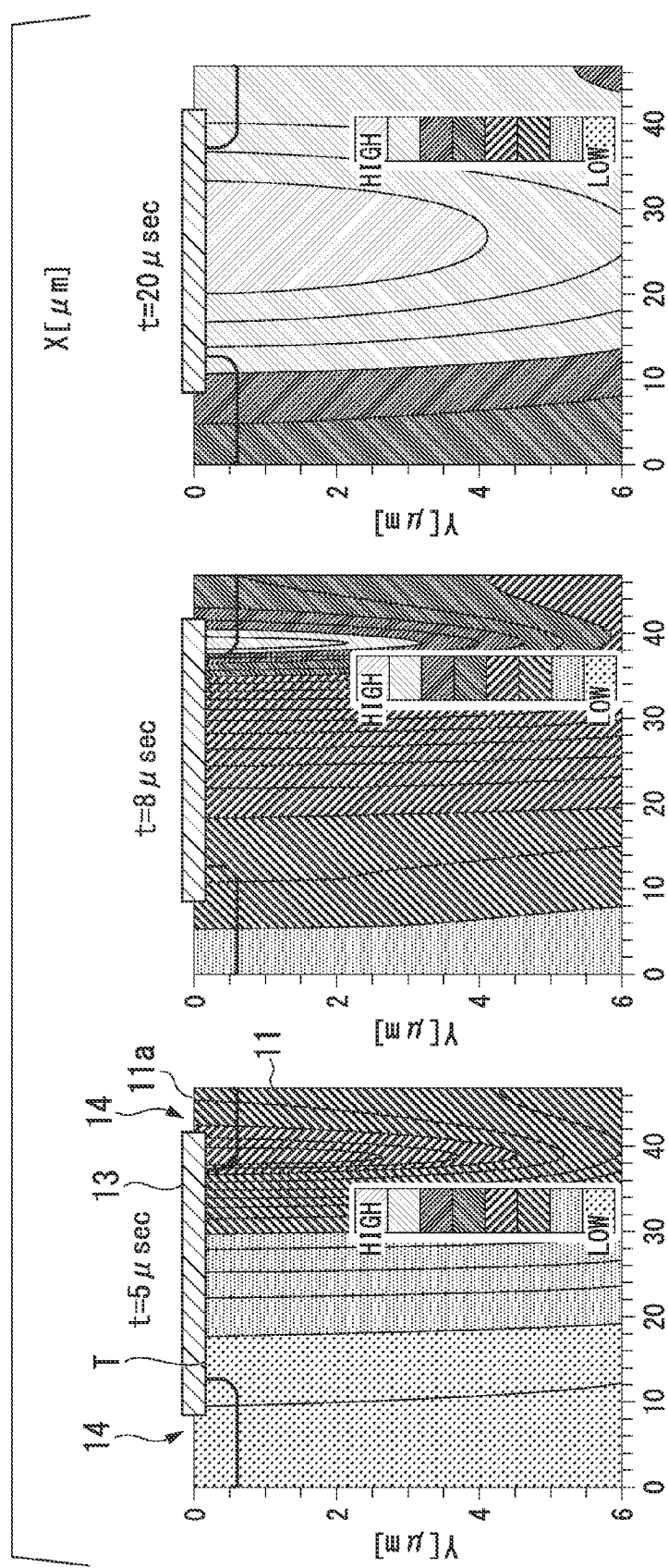
FIG. 7 is a distribution diagram of a current flow and a temperature increase in the peripheral region of the substrate in a case where the PRSM test is performed on the Schottky barrier diode according to the present invention.

FIGS. 6 and 7 are distribution diagrams showing a current flow in the peripheral region of the substrate (FIG. 6) and a distribution of a temperature increase (FIG. 7) along with the elapsed time (5 μsec, 8 μsec, 20 μsec) in a case where the rated surge reverse power (PRSM) test was similarly performed on the Schottky barrier diode (semiconductor device) shown in FIG. 1(a). Here, it was assumed in the Schottky barrier diode of the present example that the recessed portion T in size of 0.15 μm was formed on one surface side of the semiconductor substrate 11, and the metal portion 13 was formed so as to fill the recessed portion T. In the distribution diagrams shown in FIGS. 6 and 7, the metal portion 13 is shown in the upper center, and the p-type semiconductor portion 14 that is a guard ring is shown on both sides of the metal portion 13. The Schottky barrier diode shown in FIGS. 6 and 7 corresponds to the Schottky barrier diode of the present invention shown in FIG. 14.

According to the results shown in FIG. 6, as the time 5 μsec, 8 μsec, and 20 μsec elapsed, the current flow spread throughout the Schottky junction surface where the metal portion 13 was formed, and thereby concentration of current on the p-type semiconductor portion 14 was relaxed. Along with the spread of the current flow throughout the entire Schottky junction surface, the temperature distribution throughout the entire Schottky junction surface was homogenized. Thereby, the temperature increase in the vicinity of the p-type semiconductor portion 14 was relaxed as compared to the conventional examples shown in FIGS. 4 and 5 (FIG. 7). The temperature of the semiconductor substrate in the vicinity of the guard ring 6 was reduced by approximately 50 to 100° C., as compared to the conventional example shown in FIG. 5.

From the above results, simulation results was obtained, such that although in the Schottky barrier diode of the conventional example, the temperature increase in the vicinity of the guard ring might cause characteristic deterioration, while in the Schottky barrier diode of the present invention, the homogenization of the temperature distribution throughout the entire Schottky junction surface prevents the characteristic deterioration from occurring. Additionally, the rated surge reverse power became 1 kw to 2 kw, which was greatly improved as compared to the conventional example.

DESCRIPTION OF REFERENCE NUMERALS

10: Schottky barrier diode (semiconductor device)
11: semiconductor substrate
12: first semiconductor region
13: metal portion (second portion)
14: p-type semiconductor portion (first portion)
14a: p+ type semiconductor portion (first concentration portion)
14b: p− type semiconductor portion (second concentration portion)
14c: p-type semiconductor deposition portion.

The invention claimed is:

1. A semiconductor device comprising:
a semiconductor substrate of a first conductive type, the semiconductive substrate having a first surface;
a guard rind of a second conductivity type opposite to the first conductivity type, the guard ring having a first portion and a second portion, the first portion being in the semiconductor substrate and adjacent to the first surface and
the second portion being on the semiconductor substrates, and adjacent to the first surface; and
a metal layer on the semiconductive substrate, the metal layer adjacent to the first surface and forming a Schottky junction with the semiconductor substrate so as to be electrically connected to the second portion,
wherein the metal layer has a cross-section that is rectangular when viewed in a vertical direction,
a thickness from a bottom surface of the semiconductor substrate to a bottom surface of the metal layer is smaller than a thickness from the bottom surface of the semiconductor substrate to an uppermost surface of the guard ring,
the first portion of the guard ring includes a first region and a second region connected to the first region, and
the first region is closer to the metal layer than the second region, and
the second region is larger in depth in the vertical direction of the semiconductor substrate than the first region.

2. The semiconductor device according to claim 1, wherein a lower end of the second portion is curved.

3. The semiconductor device according to claim 1, wherein
the guard ring includes a first concentration portion and a second concentration portion which have different impurity concentrations from each other,
the first concentration portion includes the second portion,
a part of a side surface of the metal layer and a part of a bottom surface of the metal layer connected to the side surface thereof are in contact with a part of the first concentration portion, and
at least a part of a side surface of the second concentration portion is in contact with a side surface of the first concentration portion.

* * * * *